(12) United States Patent
Kondo et al.

(10) Patent No.: US 9,166,370 B2
(45) Date of Patent: Oct. 20, 2015

(54) VERTICAL CAVITY SURFACE EMITTING LASER, VERTICAL CAVITY SURFACE EMITTING LASER APPARATUS, OPTICAL TRANSMISSION APPARATUS, AND INFORMATION PROCESSING APPARATUS

(75) Inventors: Takashi Kondo, Kanagawa (JP); Hideo Nakayama, Kanagawa (JP); Kazutaka Takeda, Kanagawa (JP); Fumio Koyama, Tokyo (JP)

(73) Assignees: FUJI XEROX CO., LTD., Tokyo (JP); TOKYO INSTITUTE OF TECHNOLOGY, Tokyo (JP)

( * ) Notice: Subject to any disclaimer, the term of this patent is extended or adjusted under 35 U.S.C. 154(b) by 840 days.

(21) Appl. No.: 13/456,909

(22) Filed: Apr. 26, 2012

(65) Prior Publication Data

US 2013/0083304 A1     Apr. 4, 2013

(30) Foreign Application Priority Data

Oct. 4, 2011 (JP) ................ 2011-219707

(51) Int. Cl.
| | |
|---|---|
| H01S 5/00 | (2006.01) |
| H01S 5/183 | (2006.01) |
| H01S 5/10 | (2006.01) |
| H01S 5/32 | (2006.01) |
| H01S 5/20 | (2006.01) |

(52) U.S. Cl.
CPC ........... *H01S 5/18358* (2013.01); *H01S 5/1039* (2013.01); *H01S 5/18311* (2013.01); *H01S 5/209* (2013.01); *H01S 5/3211* (2013.01)

(58) Field of Classification Search
CPC .............. H01S 5/18358; H01S 5/1039; H01S 5/18311; H01S 5/209; H01S 5/3211
USPC ................ 372/45.01, 46.01, 50.124
See application file for complete search history.

(56) References Cited

U.S. PATENT DOCUMENTS

| | | | | |
|---|---|---|---|---|
| 2002/0094004 | A1* | 7/2002 | Furukawa | 372/46 |
| 2002/0150135 | A1* | 10/2002 | Naone et al. | 372/45 |

(Continued)

FOREIGN PATENT DOCUMENTS

| | | |
|---|---|---|
| JP | A-2005-108983 | 4/2005 |
| JP | A-2005-129960 | 5/2005 |
| JP | A-2009-152553 | 7/2009 |

OTHER PUBLICATIONS

Mahmoud et al., "Analysis of longitudinal mode wave guiding in vertical-cavity surface-emitting lasers with long monolithic cavity," *Applied Science Letters*, vol. 78, No. 5, pp. 586-588, 2001.

(Continued)

*Primary Examiner* — Yuanda Zhang
(74) *Attorney, Agent, or Firm* — Oliff PLC (57) ABSTRACT

A vertical cavity surface emitting laser includes a first semiconductor multilayer reflector, a resonator, and a second semiconductor multilayer reflector. The first semiconductor multilayer reflector is formed on a substrate and is configured by stacking a high refractive index layer having a relatively high refractive index and a low refractive index layer having a relatively low refractive index. The resonator includes an active layer formed on the first semiconductor multilayer reflector. The second semiconductor multilayer reflector is configured by stacking the high refractive index layer and the low refractive index layer. The resonator includes a pair of spacer layers disposed vertically on the active layer and a resonator extension area formed at one side of the pair of spacer layers. The resonator extension area contains a material in which an energy level with a crystal defect is higher than a general energy level without the crystal defect.

13 Claims, 5 Drawing Sheets

(56) References Cited

U.S. PATENT DOCUMENTS

2004/0184498 A1* 9/2004 Ueki .......................... 372/45
2005/0089074 A1 4/2005 Koelle et al.
2009/0135876 A1 5/2009 Takeuchi et al.

OTHER PUBLICATIONS

Unold et al., "Improving single-mode VCSEL performance by introducing a long monolithic cavity," *IEEE Photonics Technology Letters*, vol. 12, No. 8, pp. 939-941, 2000.

* cited by examiner

VERTICAL CAVITY SURFACE EMITTING LASER, VERTICAL CAVITY SURFACE EMITTING LASER APPARATUS, OPTICAL TRANSMISSION APPARATUS, AND INFORMATION PROCESSING APPARATUS

CROSS-REFERENCE TO RELATED APPLICATIONS

This application is based upon and claims priority under 35 USC 119 from Japanese Patent Application No. 2011-219707, filed Oct. 4, 2011.

BACKGROUND

Technical Field

The present invention relates to a vertical cavity surface emitting laser (VCSEL), a vertical cavity surface emitting laser apparatus, an optical transmission apparatus, and an information processing apparatus.

SUMMARY OF THE INVENTION

According to an aspect of the invention, a vertical cavity surface emitting laser includes a substrate, a first semiconductor multilayer reflector, a resonator, and a second semiconductor multilayer reflector. The first semiconductor multilayer reflector of a first conduction type is formed on the substrate and is configured by stacking a pair of a high refractive index layer having a relatively high refractive index and a low refractive index layer having a relatively low refractive index. The resonator includes an active layer formed on the first semiconductor multilayer reflector. The second semiconductor multilayer reflector of a second conduction type is configured by stacking a pair of the high refractive index layer having the relatively high refractive index and the low refractive index layer having the relatively low refractive index. The second conduction type is different from the first conduction type. The resonator includes a pair of spacer layers disposed vertically on the active layer and a resonator extension area formed at one side of the pair of spacer layers. The resonator extension area contains a material in which an energy level with a crystal defect is higher than a general energy level without the crystal defect.

BRIEF DESCRIPTION OF THE DRAWINGS

Exemplary embodiments of the invention will be described in detail based on the following figures, wherein.

DETAILED DESCRIPTION

Hereinafter, exemplary embodiments of the present invention will be described with reference to the accompanying drawings. A vertical cavity surface emitting laser (VCSEL) is used as a light source of a communication apparatus or an image forming apparatus. The VCSEL used as the light source is required to extend a life-span of an element by reducing a resistance value or heat dissipation performance while improving an optical output or electrostatic discharge (ESD) resistance in a single transverse mode.

As a selective oxidized vertical cavity surface emitting laser, a single transverse mode is acquired by reducing an oxidized aperture diameter of a current narrowing layer to approximately 3 microns, but when the oxidized aperture diameter is reduced, resistance of the element increases and a calorific value also increases, causing the life-span to decrease. When the oxidized aperture diameter is reduced, an optical output is also reduced. As a method for implementing a high optical output and a long life-span of the VCSEL, increasing the length of a resonator is considered. The VCSEL with the long resonator typically has a cavity in which the length of the resonator is increased by approximately 3 to 4 microns which is approximately 10 to 20 times of an oscillation wavelength. When the length of the resonator increases, a difference in optical loss between a basic transverse mode having a small spread angle and a higher transverse mode having a large spread angle increases, and as a result, the single transverse mode can be acquired even though the oxidized aperture diameter increases. By using the VCSEL having the long resonator, the oxidized aperture diameter may be increased up to 8 microns, and the optical output may also be increased up to approximately 5 mW.

In the following description, a VCSEL with a selective oxidized long resonator structure is exemplified. Scales of the figures are enlarged to easily understand the features of the present invention, and it is noted that the scales are not particularly the same as an actual size of a device.

Exemplary Embodiment

Figure 1:
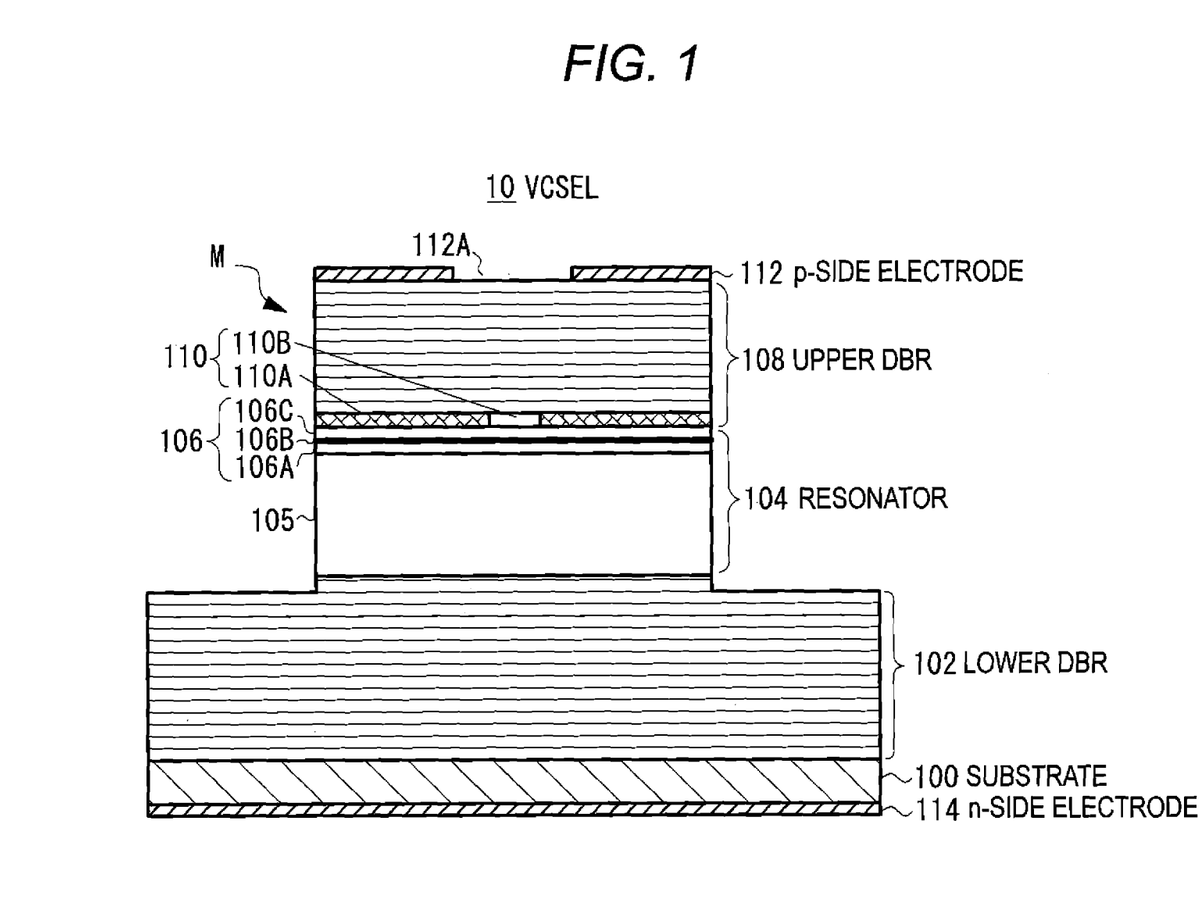
FIG. 1 is a schematic cross-sectional view of a VCSEL having a long resonator structure according to the first exemplary embodiment of the present invention.

FIG. 1 is a schematic cross-sectional view of a VCSEL having a long resonator structure according to the first exemplary embodiment of the present invention. As shown in the figure, the VCSEL 10 of the present exemplary embodiment is configured by stacking an n-type lower distributed Bragg reflector (hereinafter, referred to as DBR) 102 in which AlGaAs layers having different Al composition are alternately superimposed on each other on an n-type GaAs substrate 100, resonator 104 providing the long resonator structure formed on the lower DBR 102, and a p-type upper DBR 108 in which AlGaAs layers having different Al composition, which are formed on the resonator 104, are alternately superimposed on each other. The n-type lower DBR 102 is configured by stacking, for example, a plurality of pairs of $Al_{0.9}Ga_{0.1}As$ layer and $Al_{0.3}Ga_{0.7}As$ layer, and the thickness of each layer is $\lambda/4\,n_r$ (herein, $\lambda$ represents an oscillation wavelength, and $n_r$ represents a refractive index of a medium) and the layers are alternately stacked at 40 cycles. A carrier concentration after doping silicon as an n-type impurity is, for example, $3 \times 10^{18}$ cm$^{-3}$. The p-type upper DBR 108 is configured by stacking a plurality of pairs of p-type $Al_{0.9}Ga_{0.1}As$ layer and $Al_{0.3}Ga_{0.7}As$ layer, and the thickness of each layer is $\lambda/4$ $n_r$, and the layers are alternately stacked at 29 cycles. A carrier concentration after doping carbon as a p-type impurity is, for example, $3 \times 10^{18}$ cm$^{-3}$. A contact layer made of p-type GaAs may be formed on the uppermost layer of the upper DBR 108, and a current narrowing layer 110 made of p-type AlAs or AlGaAs is formed on the lowermost layer of the upper DBR 108 or therein.

The resonator 104 is configured to include a resonator extension area 105 formed on the lower DBR 102 and an active area 106 formed on the resonator extension area 105. The active area 106 includes a quantum well active layer 106B interposed between upper and lower spacer layers 106A and 106C, and the layer thickness of the active area 106 may be the same as the oscillation wavelength $\lambda$. The lower spacer layer 106A is, for example, an undoped $Al_{0.6}Ga_{0.4}As$ layer, the quantum well active layer 106B is an undoped $Al_{0.11}Ga_{0.89}As$ quantum well layer and an undoped $Al_{0.3}Ga_{0.7}As$ barrier layer, and the upper spacer layer 106C is an undoped $Al_{0.6}Ga_{0.4}As$ layer.

The resonator extension area 105 is a monolithic layer formed by a series of epitaxial growth, and an optical layer thickness thereof is random, but may have, for example, several $\lambda$ to tens of $\lambda$ ($\lambda$ is an oscillation wavelength). The VCSEL without a long resonator structure does not have the resonator extension area 105, and usually, the active area 106 is formed on the lower DBR 102, and thus, the optical layer thickness of the resonator 104 is $\lambda$ or less. The resonator extension area 105 may be referred to as a cavity extension area or a cavity space.

In the present exemplary embodiment, the resonator extension area 105 is made of a material in which a deep level is difficult to generate by a DX center. Preferably, the resonator extension area 105 may be made of a material in which an energy level with a crystal defect becomes higher than a general energy level with no crystal defect by the DX center. At the energy level, movement of atoms by the generation of the DX center is suppressed as described below, and as a result, deterioration in the active layer can be prevented. The resonator extension area 105 is configured by, for example, a GaInP layer injected with silicon as an n-type dopant. GaInP may have a layer thickness of $\lambda/4$ or a larger layer thickness than $\lambda/4$.

As a semiconductor layer is etched from the upper DBR 108 to the lower DBR 102, a cylindrical mesa (columnar structure) M is formed on the substrate 100. The current narrowing layer 110 is exposed to a side surface of the mesa M to have an oxidization area 110A which is selectively oxidized from the corresponding side surface and a conductive area (oxidized opening) 110B surrounded by the oxidized area 110A. A planar shape on a plane parallel to a main surface of the substrate 100 of the conductive area 110B is a circular shape to which an outer shape of the mesa M is reflected, and thus, the center thereof substantially coincides with an optical axis of an axial direction of the mesa M. As for the VCSEL 10 with the long resonator, the diameter of the conductive area 110B may be larger than that in the general VCSEL in order to acquire a basic transverse mode, and for example, the diameter of the conductive area 110B may be increased up to approximately 7 microns.

A circular p-side electrode 112 made of metal in which Ti and Au are stacked is formed on the uppermost layer of the mesa M, and the p-side electrode 112 is ohmic-connected to the contact layer of the upper DBR 108. A circular opening, that is, a light emitting opening 112A emitting light is formed on the p-side electrode 112. The center of the light emitting opening 112A coincides with the optical axis of the mesa M. An n-side electrode 114 is formed on a rear surface of the substrate 100.

When the VCSEL that does not have the long resonator structure operates in a single transverse mode, the VCSEL has one resonance wavelength, that is, one vertical mode because the length of the resonator is short. Meanwhile, in the VCSEL having the long resonator as described in the present exemplary embodiment, a plurality of resonance wavelengths may be generated, because the length of the resonator is long. The number of the generated resonance wavelengths is proportional to the size of the length of the resonator. As a result, in the VCSCEL having the long resonator structure, the resonance wavelength is easily switched in accordance with the variation in operating current (the vertical mode switching), and a bent point (kink) may be generated in an IL characteristic which is the relationship between input current and a laser output. Since the switching of the resonance wavelength is not desirable to high-speed modulation of the VCSEL, a reflection band of a laser-oscillatable reflective index (for example, 99% or more) is narrowed by decreasing a difference in refractive index between a pair of AlGaAs configuring the lower DBR 102 or a difference in refractive index between a pair of AlGaAs configuring the upper DBR 108. Therefore, the vertical-mode switching can be suppressed by selecting a desired resonance wavelength among the plurality of resonance wavelengths.

In the VCSEL having the long resonator structure, an n-type resonator extension area 105 is generally used because absorption of light can be low, and element resistance can be reduced by using the n-type resonator extension area 105. Meanwhile, when the material of the resonator extension area 105 is AlGaAs, AlGaAs influences the Al composition and n-type doping concentration (for example, silicon), and as a result, the DX center as the deep level is generated considerably a lot, thereby rapidly deteriorating the active layer 106B. The DX center as the deep level generated at a conductor side is supposed as an As defect generated by injecting an impurity as a donor into AlGaAs or GaAs.

Figure 2A:
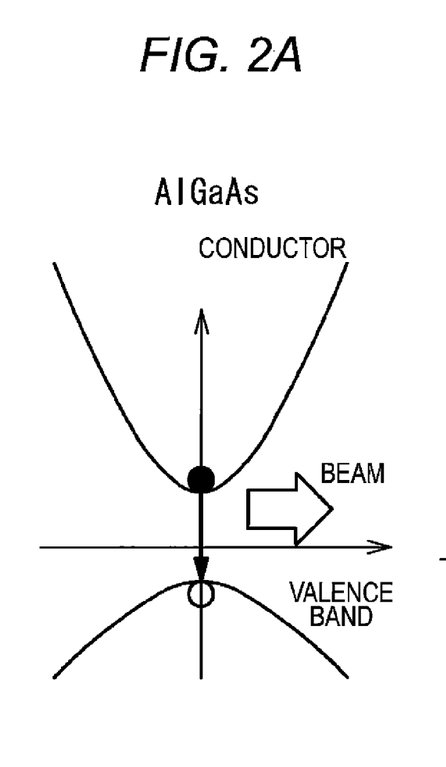
FIG. 2A is a diagram illustrating an energy band of AlGaAs.
Figure 2B:
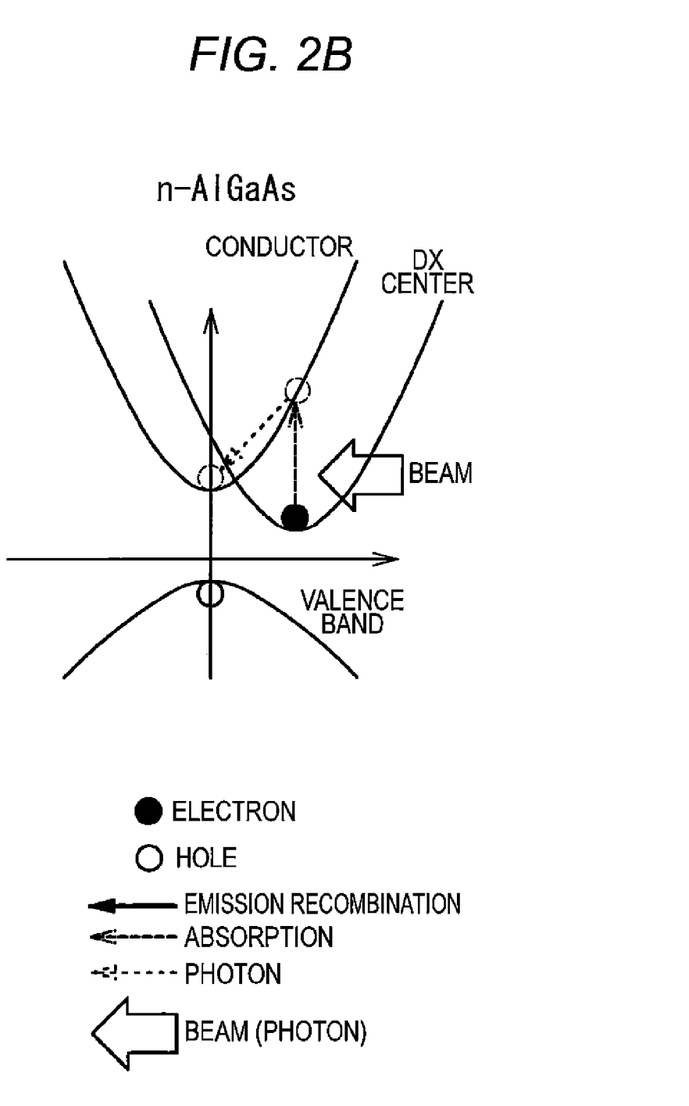
FIG. 2B is a diagram illustrating an energy band for describing a DX center of n-type AlGaAs.

FIG. 2A illustrates an energy band of AlGaAs, and FIG. 2B illustrates an energy band when the DX center is generated in the n-type AlGaAs. As shown in FIG. 2A, electrons of the conductor are combined with holes of a valence band to generate light (photon). Meanwhile, even within AlGaAs in which the Al composition is 20% or more, the energy at the DX center side is lower than that in FIG. 2A, and as a result, the electrons are trapped at the DX center. Here, in the case of a group IV donor, the donor itself moves, and in the case of a group VI donor, Ga (Al) moves. The electrons are accumulated in the DX center to absorb light, such that the electrons are released from the DX center to return to the conductor, but at that time, in the case of the group IV donor, the donor itself moves, and in the case of the group VI donor, Ga (Al) moves. Therefore, a crystal structure of the active layer is broken, thereby remarkably deteriorating the characteristic.

In the embodiment, as the material of the resonator extension area 105, a material that does not have the deep level, for example, GaInP is used, rather than AlGaAs having the deep level. As the dopant, silicon having a lattice integer close to GaInP is used, such that the deep level by the crystal defect is not formed in GaInP. Accordingly, as in AlGaAs shown in FIG. 2B, the level of the DX center is not lower than the energy level of the general conductor without the crystal defect, but the level of the DX center by GaInP is higher than the energy level of the general conductor without the crystal defect, and as a result, the electrons are trapped at the DX center to be difficult to move, and the group IV donor itself is suppressed from moving. By this configuration, the decrease in life-span resulting from the deterioration in the crystal structure of the active layer 106B caused by the DX center is prevented. As a result, it is possible to maintain reliability of the VCSEL having the long resonator structure.

In the above embodiment, although the lower DBR 102 and the upper DBR 108 are constituted by a pair of the high AlGaAs layer having a high Al composition ratio and the low AlGaAs layer having a low Al composition ratio, the lower DBR 102 and the upper DBR 108 are not limited to AlGaAs. The lower DBR 102 and the upper DBR 108 may be constituted by a pair of a high refractive-index layer having a relatively higher refractive index and a low refractive-index layer having a relatively lower refractive index. For example, the lower DBR 102 and the upper DBR 108 may be constituted by a combination of GaAs as the high refractive-index layer and AlGaAs as the low refractive-index layer. When the oscillation wavelength is long, GaAs may be used in the DBR.

Figure 3:
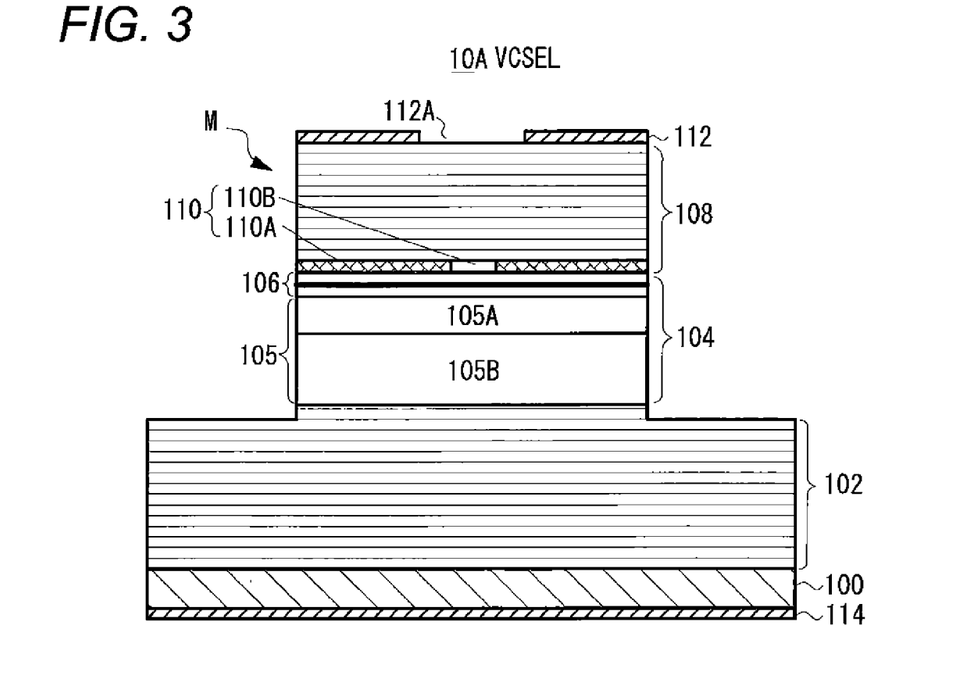
FIG. 3 is a schematic cross-sectional view of a VCSEL having a long resonator structure according to the second exemplary embodiment of the present invention.

Hereinafter, the second exemplary embodiment of the present invention will be described. FIG. 3 is a schematic cross-sectional view of a VCSEL 10A having a long resonator structure according to the second exemplary embodiment. Although the resonator extension area 105 has been made of a single material (for example, GaInP) in the first exemplary embodiment, the resonator extension area 105 may be made of a plurality of materials in the second exemplary embodiment.

As shown in FIG. 3, the resonator extension area 105 is configured to include a first spacer layer 105A made of GaInP and a second spacer layer 105B made of AlGaAs formed just therebelow. Since the second spacer layer 105B is made of the same material as the lower DBR 102, crystal may be easily grown, and the layer thickness thereof may be increased. As a result, the layer thickness of the second spacer layer 105B is larger than that of the first spacer layer 105A. The Al composition ratio of the second spacer layer 105B may be within the range of the Al composition ratio of the high refractive-index layer and the low refractive-index layer constituting the lower DBR 102, and may use the same impurity dopant (for example, silicon) as the lower DBR 102. When silicon as the impurity dopant is injected into AlGaAs, a plurality of DX centers are generated in AlGaAs as shown in FIG. 2B, and as a result, silicon is diffused or moved. However, since the first spacer layer 105A is formed in proximity of the active area 106, silicon is prevented from being diffused to the active layer 106B.

Figure 4:
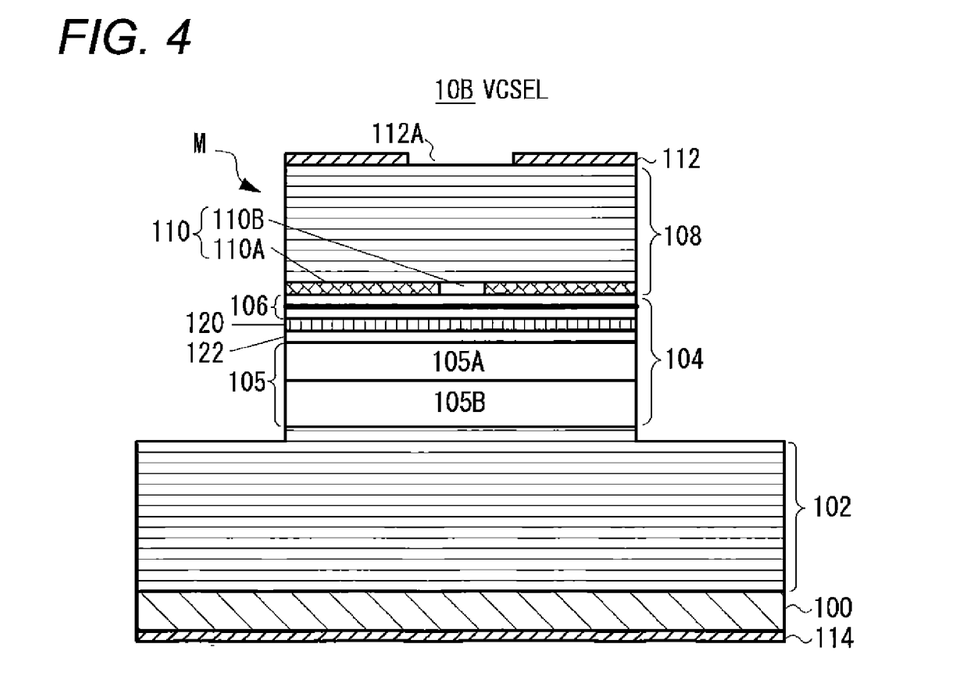
FIG. 4 is a schematic cross-sectional view of a VCSEL having a long resonator structure according to the third exemplary embodiment of the present invention.

Hereinafter, the third exemplary embodiment of the present invention will be described. FIG. 4 is a schematic cross-sectional view of a VCSEL 10B having a long resonator structure according to the third exemplary embodiment. In the third exemplary embodiment, the resonator 104 includes a carrier block layer 120 between the active area 106 and the resonator extension area 105 in addition to the configuration of the second exemplary embodiment.

The carrier block layer 120, which is made of a material having a larger band gap than the lower spacer layer 106A, serves to trap carriers in the active layer 106B. For example, when the first spacer layer 105A is made of GaInP, the carrier block layer 120 is formed by n-type $Al_xGa_{1-x}As$ ($0<X<1$) having a predetermined layer thickness to be formed near the lower spacer layer 106A. The band gap of the carrier block layer 120 may be determined by the Al composition ratio (X). Therefore, when the Al composition ratio increases, the band gap may be thus increased. When the lower DBR 102 is constituted by a pair of the $Al_{0.9}Ga_{0.1}As$ layer and the $Al_{0.3}Ga_{0.7}As$ layer, the carrier block layer 120 may be constituted by the $Al_{0.9}Ga_{0.1}As$ layer. Since it is not easy to perform crystal growth of the $Al_{0.9}Ga_{0.1}As$ layer on the GaInP layer, the $Al_{0.3}Ga_{0.7}As$ layer as a buffer layer 122 may be formed below the carrier block layer 120. The optical layer thickness of each of the carrier block layer 120 and the buffer layer 122 may be $\lambda/4$ of the oscillation wavelength.

As such, according to the third exemplary embodiment, the carrier block layer 120 may be interposed to improve emission efficiency of the VCSEL 10B.

Figure 5:
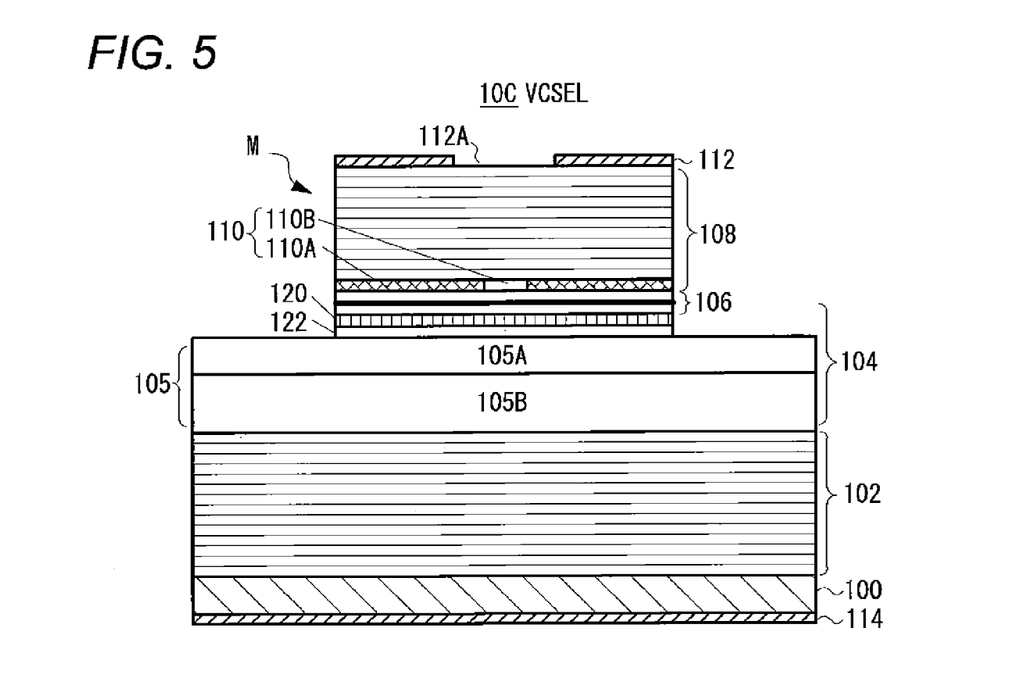
FIG. 5 is a schematic cross-sectional view of a VCSEL having a long resonator structure according to the fourth exemplary embodiment of the present invention.

Hereinafter, the fourth exemplary embodiment of the present invention will be described. FIG. 5 is a schematic cross-sectional view of a VCSEL 10C having a long resonator structure according to the fourth exemplary embodiment. In the fourth exemplary embodiment, when the first spacer layer 105A is made of GaInP, the first spacer layer 105A may be used as an etching stopper when etching the mesa M. For example, when the mesa M is formed by reactive ion etching using boron trichloride as etching gas, a selection ratio of etching is generated in AlGaAs and GaInP, and as a result, etching the GaInP layer may be precisely stopped. The etching gas is one example and other etchant having the selection ratio in etching AlGaAs and GaInP may be used.

In the third and fourth exemplary embodiments, the example in which the resonator extension area 105 is constituted by the first and second spacer layers 105A and 105B has been described, but the resonator extension area 105 may be made of a single material as described in the first exemplary embodiment. In the above embodiment, although the example of using the n-type GaAs substrate has been described, the p-type GaAs substrate may be used as well. In this case, conductivity types of the semiconductor layers formed on the substrate are reversed, respectively. That is, the p-type lower DBR is formed on the substrate, and the current narrowing layer is formed at a position adjacent to the active area of the lower DBR. The mesa M has at least a depth extending to the current narrowing layer. The resonator extension area is formed on the active area, and the upper DBR is thus formed thereon.

The diameter of the conductive area (oxidized aperture) 110B of the current narrowing layer 110 may be appropriately changed according to the required optical output. The buffer layer may be formed between the GaAs substrate 100 and the lower DBR 102 as necessary. In the above exemplary embodiment, the GaAs based VCSEL has been described, but the present invention may also be applied to a VCSEL having a long resonator using another III-V-group compound semiconductor. In the above exemplary embodiment, the single-spot VCSEL has been described, but a multi-spot VCSEL or a VCSEL array in which a plurality of mesas (light emitting units) are formed on the substrate may be used.

Figure 6A:
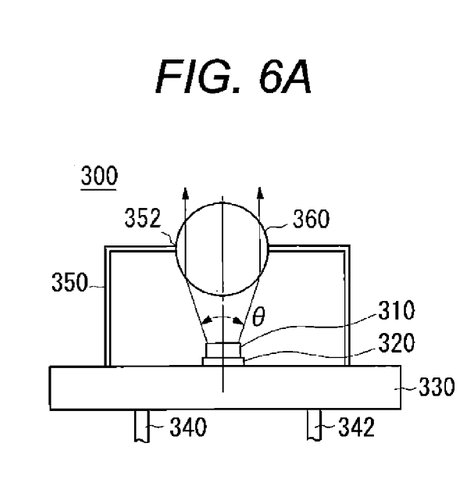
FIGS. 6A and 6B are schematic cross-sectional views illustrating a configuration of a VCSEL apparatus in which an optical member is mounted on the VCSEL according to the present exemplary embodiment.

Hereinafter, the VCSEL apparatus, an optical information processing apparatus, and an optical transmission apparatus using the VCSEL according to the present exemplary embodiment will be described with reference to the accompanying drawings. FIG. 6A is a cross-sectional view illustrating a configuration of a VCSEL apparatus mounted (packaged) with a VCSEL and an optical member. In the VCSEL apparatus 300, a chip 310 where a VCSEL with a long resonator is formed is fixed onto a disk-shaped metal stem 330 through a conductive adhesive 320. Conductive leads 340 and 342 are inserted into through-holes (not shown) formed on the stem 330, and one lead 340 is electrically connected to an n-side electrode of the VCSEL, and the other lead 342 is electrically connected to a p-side electrode.

A rectangular hollow cap 350 is fixed onto the stem 330 including the chip 310, and an optical member ball lens 360 is fixed within a center opening 352 of the cap 350. The position of an optical axis of the ball lens 360 is determined so that the optical axis of the ball lens 360 coincides substantially with the center of the chip 310. When a forward voltage is applied between the leads 340 and 342, a laser beam is emitted vertically from the chip 310. A distance between the chip 310 and the ball lens 360 is adjusted so that the ball lens 360 is included in a spread angle θ of the laser beam from the chip 310. A light receiving element or a temperature sensor for monitoring a light emitting state of the VCSEL may be included in the cap.

Figure 6B:
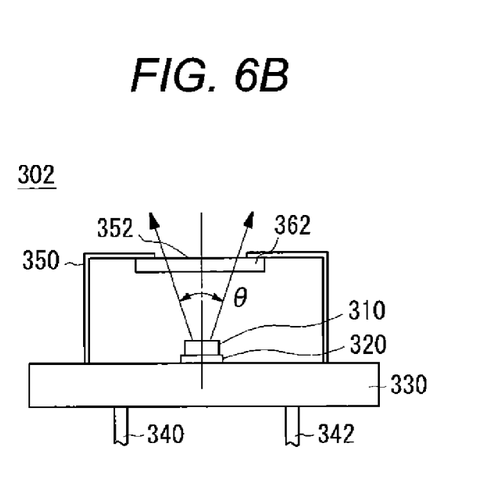

FIG. 6B is a diagram illustrating a configuration of another VCSEL apparatus. In a VCSEL apparatus 302 illustrated in the figure, a flat glass 362 is fixed in the center opening 352 of the cap 350 instead of using the ball lens 360. The position of the center of the flat glass 362 is determined so that the center of the flat glass 362 coincides substantially with the center of the chip 310. A distance between the chip 310 and the flat glass 362 is adjusted so that an opening size of the flat glass 362 is equal to or more than the spread angle θ of the laser beam from the chip 310.

Figure 7:
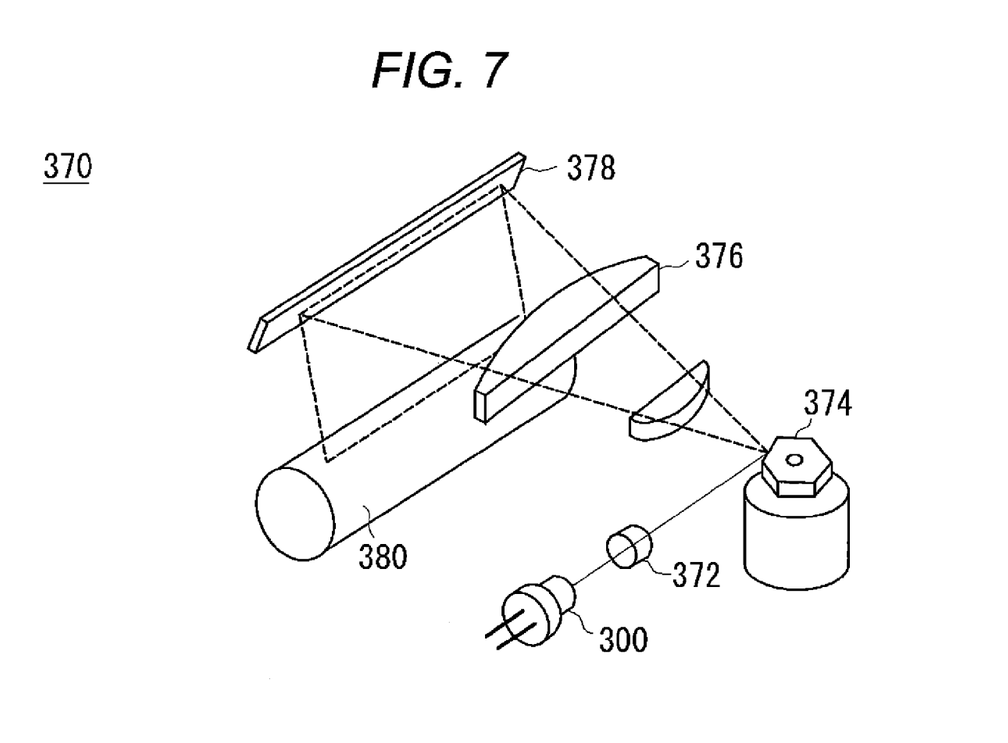
FIG. 7 is a diagram illustrating an example of a configuration of a light source apparatus using the VCSEL according to the present exemplary embodiment.

FIG. 7 is a diagram illustrating an example of applying a VCSEL to a light source of an optical information processing apparatus. As shown in FIG. 6A or 6B, the optical information processing apparatus 370 includes a collimator lens 372 on which the laser beam from the VCSEL apparatus 300 or 302 mounted with the VCSEL with the long resonator is incident, a polygon mirror 374 that rotates at a predetermined speed to reflect a beam from the collimator lens 372 at a predetermined spread angle, a fθ lens 376 in which the laser beam from the polygon mirror 374 is incident to irradiate the incident laser beam to a reflection mirror 378, a line-type reflection mirror 378, and a photoreceptor drum (recording medium) 380 forming a latent image based on the reflection beam from the reflection mirror 378. As such, the VCSEL may be used as a light source of the optical information processing apparatus such as a copy machine or a printer including an optical system focusing the laser beam from the VCSEL on the photoreceptor drum and a mechanism scanning the focused laser beam on an illuminant drum.

Figure 8:
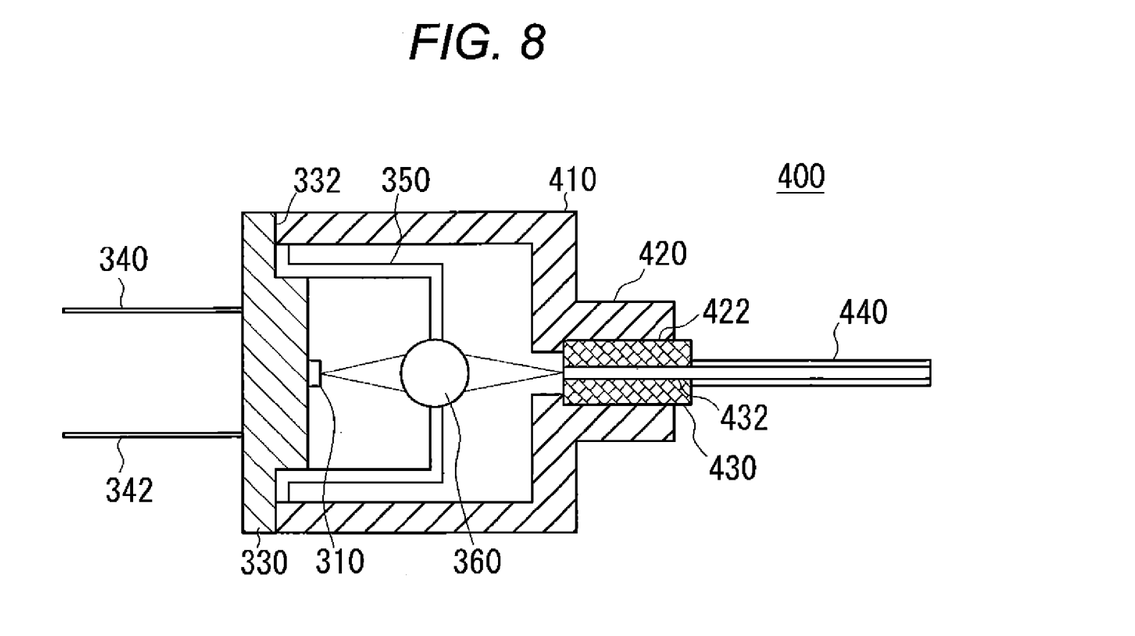
FIG. 8 is a schematic cross-sectional view illustrating a configuration of an optical transmission apparatus using the vertical cavity surface emitting laser apparatus illustrated in FIG. 6A.

FIG. 8 is a cross-sectional view illustrating a configuration when the VCSEL apparatus illustrated in FIG. 6A is applied to the optical transmission apparatus. The optical transmission apparatus 400 includes a cylindrical case 410 fixed to the stem 330, a sleeve 420 integrally formed on a cross section of the case 410, a ferrule 430 held in an opening 422 of the sleeve 420, and an optical fiber 440 held by the ferrule 430. An end of the case 410 is fixed to a flange 332 formed in a circumferential direction of the stem 330. The ferrule 430 is accurately positioned in the opening 422 of the sleeve 420, and an optical axis of the optical fiber 440 is matched to the optical axis of the ball lens 360. A central line of the optical fiber 440 is held in a through-hole 432 of the ferrule 430.

The laser beam emitted from the surface of the chip 310 is focused by the ball lens 360, and the focused beam is incident in the central line of the optical fiber 440 to be transmitted. As for the example, the ball lens 360 is used, but another lens such as a biconvex lens or a plano-convex lens may be used. The optical transmission apparatus 400 may include a driving circuit for applying an electrical signal to the leads 340 and 342. The optical transmission apparatus 400 may have a receiving function for receiving an optical signal through the optical fiber 440.

As set forth above, although the exemplary embodiments of the present invention have been described, the present invention is not limited to a specific embodiment, but various modifications and changes can be made within the scope of the present invention which is included in the appended claims.

The foregoing description of the exemplary embodiment of the present invention has been provided for the purpose of illustration and description. It is not intended to be exhaustive or to limit the invention to the precise forms disclosed. Obviously, many modifications and various will be apparent to practitioners skilled in the art. The embodiments were chosen and described in order to best explain the principles of the invention and its practical application, thereby enabling other skilled in the art to understand the invention for various embodiments and with the various modifications as are suited to the particular use contemplated. It is intended that the scope of the invention be defined by the following claims and their equivalents.

What is claimed is:

1. A vertical cavity surface emitting laser comprising:
a substrate;
a first semiconductor multilayer reflector of a first conduction type that is formed on the substrate and is configured by stacking a pair of a high refractive index layer having a relatively high refractive index and a low refractive index layer having a relatively low refractive index;
a resonator that includes an active layer formed on the first semiconductor multilayer reflector; and
a second semiconductor multilayer reflector of a second conduction type that is configured by stacking a pair of the high refractive index layer having the relatively high refractive index and the low refractive index layer having the relatively low refractive index, the second conduction type being different from the first conduction type,
wherein the resonator includes a pair of spacer layers disposed vertically on the active layer and a resonator extension area formed at one side of the pair of spacer layers, and
the resonator extension area includes an n-type GaInP layer and an n-type AlGaAs layer, and the GaInP layer is interposed between the active layer and the AlGaAs layer.

2. The vertical cavity surface emitting laser according to claim 1, wherein the resonator includes a carrier barrier layer that traps carriers in the active layer between one spacer layer of the active layer and the resonator extension area.

3. The vertical cavity surface emitting laser according to claim 1, wherein the thickness of the n-type GaInP layer is more than ¼ of an oscillation wavelength.

4. The vertical cavity surface emitting laser according to claim 1, wherein silicon is injected into the n-type GaInP layer as an impurity.

5. The vertical cavity surface emitting laser according to claim 1, wherein the layer thickness of the n-type AlGaAs layer is larger than that of the GaInP layer.

6. The vertical cavity surface emitting laser according to claim 4, wherein silicon is also injected into the n-type AlGaAs layer as the impurity.

7. The vertical cavity surface emitting laser according to claim 1, wherein a columnar structure including the second semiconductor multilayer reflector is formed on the substrate, and a current narrowing layer including an oxidization area which is selectively oxidized is formed in the columnar structure.

8. The vertical cavity surface emitting laser according to claim 7, wherein when the columnar structure is formed by etching, the resonator extension area serves as an etching stop layer.

9. A vertical cavity surface emitting laser apparatus comprising:
the vertical cavity surface emitting laser according to claim 1; and
an optical member on which a beam is incident from the vertical cavity surface emitting laser.

10. An optical transmission apparatus comprising:
the vertical cavity surface emitting laser apparatus according to claim 9; and
a transmitting unit that transmits a laser beam generated from the vertical cavity surface emitting laser apparatus through an optical medium.

11. An information processing apparatus comprising:
the vertical cavity surface emitting laser according to claim 1;
a light focusing unit that focuses a laser beam emitted from the vertical cavity surface emitting laser on a recording medium; and
a scan unit that scans the recording medium by the laser beam focused by the light focusing unit.

12. A vertical cavity surface emitting laser comprising:
a substrate;
a first semiconductor multilayer reflector of a first conduction type that is formed on the substrate and is configured by stacking a pair of a high refractive index layer having a relatively high refractive index and a low refractive index layer having a relatively low refractive index;
a resonator that includes an active layer formed on the first semiconductor multilayer reflector; and
a second semiconductor multilayer reflector of a second conduction type that is configured by stacking a pair of the high refractive index layer having the relatively high refractive index and the low refractive index layer having the relatively low refractive index, the second conduction type being different from the first conduction type,
wherein;
the resonator includes a pair of spacer layers disposed vertically on the active layer and a resonator extension area formed at one side of the pair of spacer layers,
the resonator extension area is constituted by an n-type GaInP layer,
the resonator include a carrier barrier layer that traps carriers in the active layer between one spacer layer of the active layer and the resonator extension area, and
a buffer layer having an Al composition ratio lower than an Al composition ratio of the carrier barrier layer is formed between the carrier barrier layer and the GaInP layer.

13. The vertical cavity surface emitting laser according to claim 12, wherein silicon is injected into the n-type GaInP layer as an impurity.

* * * * *